(12) United States Patent
Kwon et al.

(10) Patent No.: US 7,515,099 B2
(45) Date of Patent: Apr. 7, 2009

(54) RADAR SYSTEM HAVING SINGLE CIRCULARLY POLARIZED ANTENNA

(75) Inventors: Sang-wook Kwon, Seongnam-si (KR); Song-cheol Hong, Daejeon (KR); In-sang Song, Seoul (KR); Dong-kyun Kim, Suwon-si (KR); Jeong-geun Kim, Gimpo-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 293 days.

(21) Appl. No.: 11/441,081

(22) Filed: May 26, 2006

(65) Prior Publication Data
US 2007/0013582 A1 Jan. 18, 2007

(30) Foreign Application Priority Data
Jul. 13, 2005 (KR) .................... 10-2005-0063434

(51) Int. Cl.
*G01S 13/00* (2006.01)
(52) U.S. Cl. ........................................ 342/188; 342/70
(58) Field of Classification Search ............. 342/70–73, 342/188, 194
See application file for complete search history.

(56) References Cited

U.S. PATENT DOCUMENTS

| | | | |
|---|---|---|---|
| 3,422,430 A * | 1/1969 | Rittenbach | 342/114 |
| 4,742,354 A | 5/1988 | Wen et al. | |
| 4,931,799 A | 6/1990 | Wen et al. | |
| 5,500,646 A * | 3/1996 | Zrnic | 342/188 |
| 6,859,163 B2 * | 2/2005 | Alford et al. | 342/26 D |
| 6,987,481 B2 * | 1/2006 | Fehrenbach et al. | 342/124 |

FOREIGN PATENT DOCUMENTS

| | | |
|---|---|---|
| DE | 198 03 067 A1 | 7/1999 |
| JP | 2001-21643 A | 1/2001 |

OTHER PUBLICATIONS

Verweyen, Ludger et al.: "Coplanar Integrated Mixers for 77-GHz Automotive Applications", IEEE Microwave and Guided Wave Letters, IEEE Inc., New York, US, vol. 8, No. 1, Jan. 1998, pp. 38-40, ISSN: 1051-8207.
Jeong-Geun, Kim et al.: "24 GHz circularly polarized Doppler radar with a single antenna", 2005 European Microwave, European Microwave Association, UK, 2006, p. 4, ISSN: 2-9600551-2-8.

* cited by examiner

*Primary Examiner*—Isam Alsomiri
(74) *Attorney, Agent, or Firm*—Sughrue Mion, PLLC

(57) ABSTRACT

A radar system includes a transmitter stage for generating a certain transmission signal; a circularly polarized antenna for emitting the transmission signal in a form of a circularly polarized signal, and receiving a reflection signal; a polarizer for isolating the reflection signal received from the circularly polarized antenna from the transmission signal, and outputting the reflection signal to a next stage; and a receiver stage for receiving the reflection signal output from the polarizer, converting the reflection signal into a signal of a certain frequency by using as a certain mixer switching signal the leakage signal leaking from the transmitter stage, and outputting the converted reflection signal. Therefore, the high-sensitivity radar system can be built in a compact size.

19 Claims, 3 Drawing Sheets

RADAR SYSTEM HAVING SINGLE CIRCULARLY POLARIZED ANTENNA

CROSS-REFERENCE TO RELATED APPLICATIONS

This application claims priority from Korean Patent Application No. 10-2005-0063434, filed on Jul. 13, 2005, the entire contents of which are incorporated herein by reference.

BACKGROUND OF THE INVENTION

1. Field of the Invention

The present invention relates to a radar system using a circularly polarized signal. More particularly, the present invention relates to a super compact radar system of high sensitivity capable of receiving and sending a circularly polarized signal using a single circularly polarized antenna.

2. Description of the Related Art

A radar system is a system emitting a signal wave into free space using an antenna and receiving a signal wave reflected from a target object, thereby sensing a distance, a location, and so on, with respect to the target object. Such a radar system may be implemented in a large system such as a military radar or a weather radar, but recently, is being also implemented in a small system enabling individuals to use, for example, a vehicle rear-side sensor.

The radar system essentially uses an antenna to receive and send a signal wave. The antenna is classified into the linearly polarized antenna and the circularly polarized antenna according to the polarization property. The linearly polarized antenna refers to an antenna receiving and sending a linearly polarized wave (LP) traveling in a linear vector locus in a direction perpendicular to a signal-traveling direction. The circularly polarized antenna refers to an antenna receiving and sending a circularly polarized wave (CP) traveling in a circular spring-shaped locus with an electric field rotating on a vibration plane. The circularly polarized wave (CP) can be divided into a right-hand circularly polarized wave (RHCP) traveling while rotating in the right direction and a left-hand circularly polarized wave (LHCP) traveling while rotating in the left direction.

If the circularly polarized antenna is used and a transmission signal is emitted as a left-hand circularly polarized wave, the transmission signal turns into a right-hand circularly polarized wave since the characteristics of the polarized wave changes when the polarized wave is reflected from a target object. Therefore, if the left-hand circularly polarized wave antenna is used for a transmission antenna, the right-hand circularly polarized wave antenna has to be used for a reception antenna to enable a signal reflected from a target object to be received. As above, if a radar system uses the circularly polarized wave antenna, two antennas must be used which are opposite in polarization characteristics to each other. However, if two antennas are used, there exists a problem in that the radar system becomes too large in size. Therefore, it is common to use one linearly polarized wave antenna to build a small-sized radar system.

If one linearly polarized wave antenna is used, there occurs an interference problem between transmission and reflection signals. In order to prevent such a problem, a circulator or a coupler is used which can isolate the transmitter stage from the receiver stage.

Since the isolation degree between the transmitter and receiver stage becomes lower in high frequency bands as in millimeter waves if the circulator is used, a signal of the transmitter stage having high output power is introduced into the receiver stage. Thus, there exists a problem in that it is difficult to detect a weak reflection signal since the reception sensitivity of the radar system is deteriorated. Further, there is a problem in that the noise figure of the receiver stage is degraded due to a large leakage signal of the transmitter stage. Furthermore, there is a problem in that the characteristics of the entire radar system are degraded since the low-noise amplifiers or mixers constituting the receiver stage are saturated.

Meanwhile, when the coupler is used, half of the transmission power is consumed across an end terminal resistor of the coupler since one port of the coupler ends up with a resistor having resistance of 50 ohms. Further, even through received, the other half of the power is introduced into the transmitter stage. Thus, power loss of 6 dB occurs theoretically. If a circuit operates in millimeter wave bands, it is difficult to obtain a high output since small-sized devices are used to increase its frequency characteristics. If the power loss of about 6 dB occurs, a problem is caused which adversely affects the performance of the radar system of millimeter wave bands as well as degrades the signal-to-noise ratio (SNR) characteristics of the radar system.

FIG. 1A and FIG. 1B are views for explaining drawbacks of a conventional radar system using the linearly polarized wave antenna. In FIG. 1A, if a signal reflected from a target object rotates during returning, signal attenuation occurs. That is, if a signal having a magnitude of E in the vertical direction rotates by as much as an angle θ in the right direction, the magnitude of a reflection signal received through the receiver stage is reduced to Ecosθ. Thus, the sensitivity of the radar system is degraded.

FIG. 1B shows that two opposite radar systems exist. Transmission signals between the radar systems serve as interference signals since the transmission signals are much larger than a signal reflected from a target object. Thus, there exists a problem of difficulty in receiving desired signals.

SUMMARY OF THE INVENTION

Illustrative, non-limiting embodiments of the present invention overcome the above disadvantages and other disadvantages not described above. Also, the present invention is not required to overcome the disadvantages described above, and an illustrative, non-limiting embodiment of the present invention may not overcome any of the problems described above.

The present invention provides a radar system using one circularly polarized antenna, capable of enhancing the reception sensitivity and achieving super compactness.

The present invention also provides a radar system using one circularly polarized antenna to enable high sensitivity and super compactness as well as preventing adverse effect due to self mixing by using a leakage signal during signal transmissions to convert a reflection signal.

According to an aspect of the present invention, there is provided a radar system, comprising a transmitter stage for generating a certain transmission signal; a circularly polarized antenna for emitting the transmission signal in a form of a circularly polarized signal, and receiving a reflection signal; a polarizer for isolating the reflection signal received from the circularly polarized antenna from the transmission signal, and outputting the received signal to a next stage; and a receiver stage for receiving a reflection signal output from the polarizer.

The polarizer isolates the transmission signal and the reflection signal by making a phase difference of 90° between the transmission signal and the reflection signal.

The transmitter stage may include an oscillator for generating the transmission signal; a directional coupler for coupling the transmission signal generated from the oscillator, and extracting a certain leakage signal from the transmission signal; and a power amplifier for amplifying power of the transmission signal, and transmitting the amplified transmission signal to the polarizer. into a signal of a certain frequency by using as a mixer switching signal the leakage signal amplified by the second amplifier, and outputting the converted signal; and a filter for filtering an output signal of the single-ended mixer.

The polarizer may include one of a directional coupler, a Lange coupler, and a Branch-line coupler.

BRIEF DESCRIPTION OF THE DRAWINGS

The above and other aspects of the present invention will be more apparent by describing exemplary embodiments of the present invention with reference to the accompanying drawings, in which.

DETAILED DESCRIPTION OF THE EXEMPLARY EMBODIMENTS

Figure 1A:
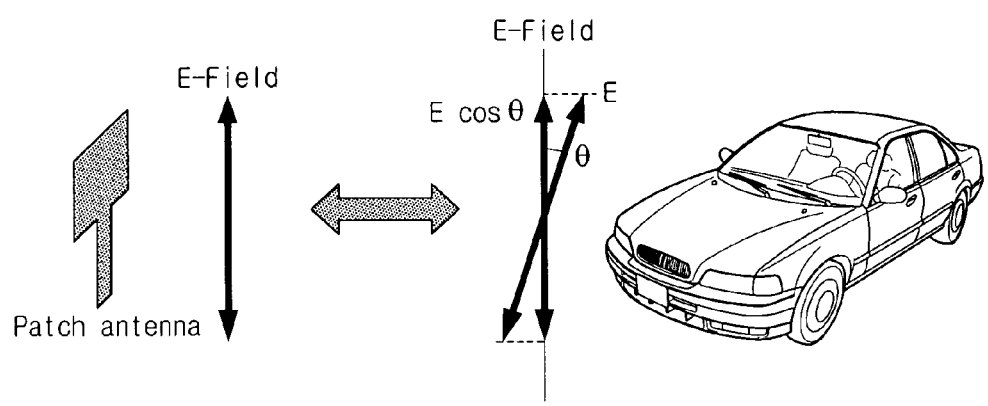
FIG. 1A and FIG. 1B are views for explaining problems of a conventional radar system.
Figure 1B:
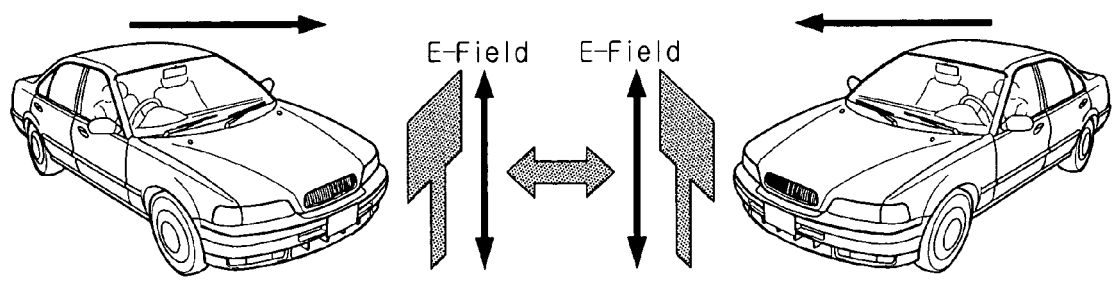

Hereinafter, exemplary embodiments of the present invention will be described in detail with reference to the accompanying drawings.

In the following description, same drawing reference numerals are used for the same elements even in different drawings. The matters defined in the description such as a detailed The receiver stage may include a low-noise amplifier for amplifying the reflection signal received from the polarizer; a mixer for receiving the leakage signal extracted from the directional coupler, and mixing the reflection signal amplified from the low-noise amplifier and the leakage signal, thereby outputting a signal of a certain frequency; and a filter for filtering the output signal of the mixer.

The polarizer may include one of the directional coupler, a Lange coupler, and a Branch-line coupler.

According to another aspect of the present invention, there is provided a radar system, comprising a transmitter stage for generating a certain transmission signal; a circularly polarized antenna for emitting the transmission signal in a form of a circularly polarized signal, and receiving a reflection signal; a polarizer for isolating the reflection signal received from the circularly polarized antenna from the transmission signal, and outputting the reflection signal to a next stage; and a receiver stage for receiving a reflection signal output from the polarizer, converting the reflection signal into a signal of a certain frequency by using as a certain mixer switching signal the leakage signal leaking from the transmitter stage, and outputting the converted reflection signal.

The polarizer isolates the transmission signal and the reflection signal by making a phase difference of 90° between the transmission signal and the reflection signal.

The transmitter stage may include an oscillator for generating the transmission signal; and a power amplifier for amplifying the transmission signal generated from the oscillator to a certain signal level.

The receiver stage may include a first amplifier for amplifying the reflection signal delivered through the polarizer; a second amplifier for receiving the leakage signal leaking from the transmitter stage, and amplifying the received leakage signal to a certain signal level; a single-ended mixer for converting the reflection signal amplified by the first amplifier construction and elements are provided to assist in a comprehensive understanding of the invention. However, the present invention can be carried out without those defined matters. Also, well-known functions or constructions are not described in detail since they could obscure the invention in unnecessary detail.

Figure 2:
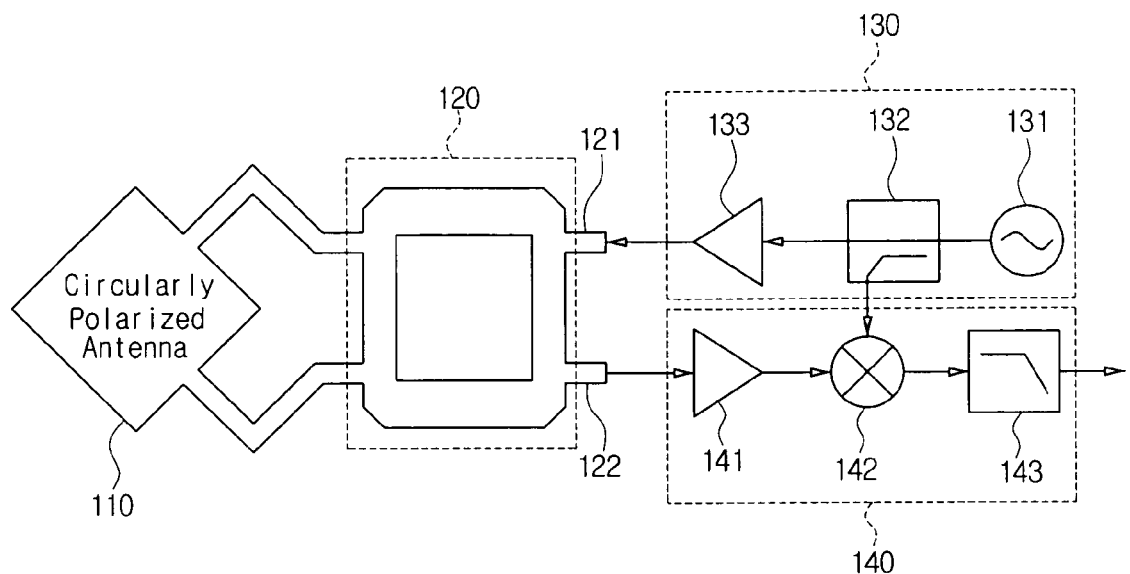
FIG. 2 is a view for showing a structure of a radar system according to an exemplary embodiment of the present invention.

FIG. 2 is a view for showing a structure of a radar system according to an exemplary embodiment of the present invention. In FIG. 2, the radar system includes a circularly polarized antenna 110, a polarizer 120, a transmitter stage 130, and a receiver stage 140.

The transmitter stage 130 generates a transmission signal which is to be externally emitted. The transmitter stage 130 includes an oscillator 131, a directional coupler 132, and a power amplifier 133. The oscillator 131 generates a transmission signal having a certain frequency, and outputs the transmission signal to the directional coupler 132. The directional coupler 132 couples the received transmission signal, and extracts a leakage signal of certain electric power. In the meantime, the transmission signal passed through the directional coupler 132 is amplified to a predetermined signal level by the power amplifier 133, and the amplified transmission signal is thus input to the first port 121 of the polarizer 120.

The polarizer 120 includes the first port 121 and a second port 122. The first and second ports 121 and 122 are input and output ports for delivering a circularly polarized signal of different waves, respectively. That is, if the first port 121 is a right-handed circular polarized port (RHCP), and the second port 122 is a left-handed circular polarized port (LHCP). On the contrary, if the first port 121 is the left-handed circularly polarized port, the second port 122 is the right-handed circularly polarized port. The polarizer 120 inputs a transmission signal through the first port 121, and outputs the reflection signal received through the circularly polarized antenna 110 to the receiver stage 140 via the second port 122.

The transmission signal input through the first port 121 is delivered to the circularly polarized antenna 110 through the polarizer 120. The circularly polarized antenna 110 emits a transmission signal into free space in the form of a circularly polarized signal. In detail, the circularly polarized antenna 110 may be implemented by a patch antenna. The emitted transmission signal is reflected by a target object, and travels again toward the radar system. The reflection signal reflected from the target object changes the polarized direction to the opposite direction. That is, if the circularly polarized antenna 110 emits the right-handed circularly polarized signal, the reflection signal becomes a left-handed circularly polarized signal. However, if the circularly polarized antenna 110 emits the left-handed circularly polarized signal, the reflection signal becomes the right-handed circularly polarized signal. The reflection signal changed in the polarized direction is sent to the receiver stage 140 through the second port 122. As above, a single circularly polarized antenna can emit a transmission signal as well as receiving a reflected signal.

Meanwhile, the polarizer 120 isolates the transmission signal input through the first port 121 from the reflection signal received through the circularly polarized antenna 110. In detail, the polarizer 120 may comprise any of a directional coupler, a Lange coupler, and a Branch-line coupler. Thus, the polarizer 120 isolates transmission and reflection signals by making a phase difference of 90° between the transmission and reflection signals.

The receiver stage 140 receiving a signal from the polarizer 120 includes an amplifier 141, a mixer 142, and a filter 143. The amplifier 141 amplifies a weak reflection signal received through the circularly polarized antenna 110 to a certain signal level. It may be preferable to use a low-noise amplifier, i.e., an amplifier designed with a noise factor of about 1.5~2, as the amplifier 141.

The signal amplified by the amplifier 141 is input to the mixer 142. The mixer 142 receives a reflection signal from the amplifier 141 and a leakage signal extracted from the directional coupler 132 of the transmitter stage 130. Thus, the mixer 142 mixes and amplifies the reflection signal and the leakage signal to generate a signal of a certain frequency. In detail, the mixer 142 shifts a frequency of the leakage signal to match a frequency of the reflection signal, thereby amplifying the reflection signal. The filter 143 filters the reflection signal amplified and output by the mixer 142. The filtered signal is signal-processed in a base-band signal processor (not shown) for calculations of data such as a distance from a target object, and so on. Thus, the radar system can be implemented with only one circularly polarized antenna 110.

Figure 3:
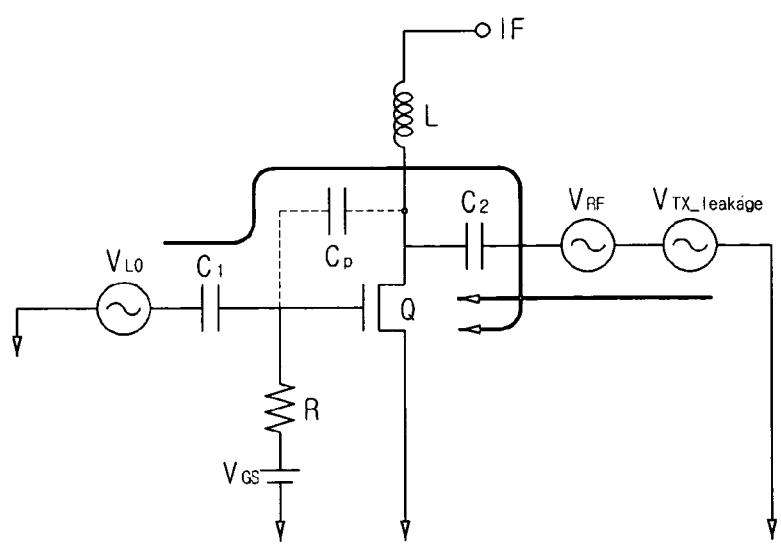
FIG. 3 is a circuit diagram for showing a structure of a mixer used in the radar system of FIG. 2.

FIG. 3 is a circuit diagram for showing a structure of the mixer 142 used in the radar system of FIG. 2. The mixer 142 includes a metal oxide semiconductor (MOS) transistor Q, capacitors $C_1$ and $C_2$, an inductor L, a resistor R. Although the mixer 142 includes the MOS transistor Q it may alternatively include a bipolar junction transistor (BJT). The MOS transistor Q receives a signal $V_{LO}$ through a gate electrode from the oscillator 131, and a reflection signal $V_{RF}$ and a leakage signal $V_{TX\_leakage}$ through a drain electrode. The inductor L operates as a radio frequency (RF) choke that cuts off leakage of an RF signal into an output terminal. The resistor R and the power source $V_{GS}$ are provided for applying a bias voltage to the gate of the transistor Q. The mixer 142 uses the leakage signal to amplify the reflection signal at the same time of using the signal $V_{LO}$ as a switching signal to convert the reflection signal into a signal of a certain frequency, thereby generating an intermediate frequency (IF) signal. The generated IF signal is output to the filter 143.

Figure 4:
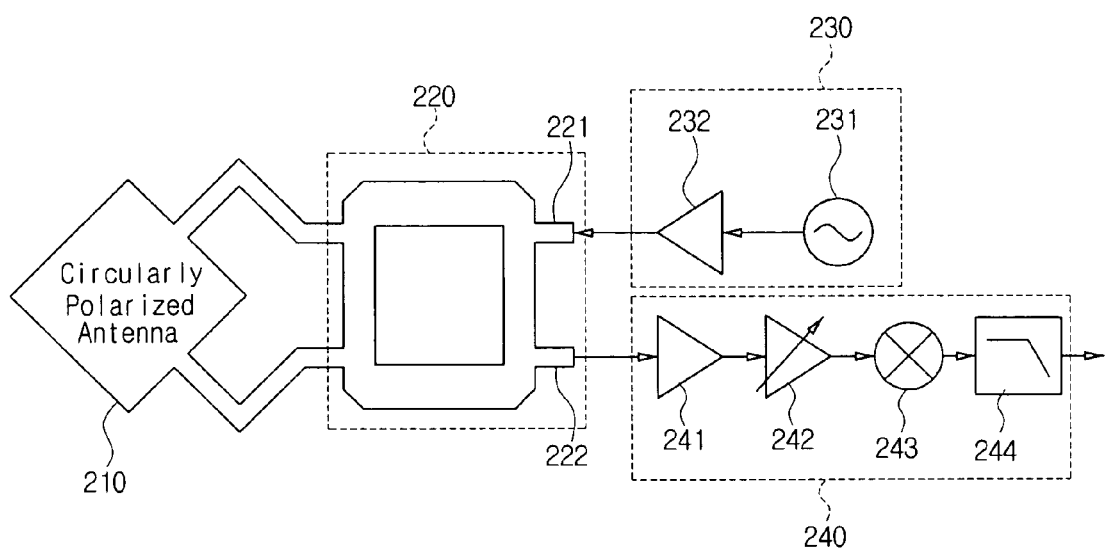
FIG. 4 is a view for showing a structure of a radar system according to another exemplary embodiment of the present invention.

FIG. 4 is a view for showing a structure of a radar system according to another exemplary embodiment of the present invention. In FIG. 4, the present radar system includes a circularly polarized antenna 210, a polarizer 220, a transmitter stage 230, and a receiver stage 240.

The circularly polarized antenna 210 and the polarizer 220 each have the same structure as those shown in FIG. 3. That is, the circularly polarized antenna 210 emits a transmission signal generated in the transmitter stage 230 into a free space in the form of a circularly polarized signal, and receives a reflected signal.

The polarizer 220 isolates the transmission and reflection signals by making a phase difference of 90° between the transmission and reflection signals. The polarizer 220 may comprise any of a directional coupler, a Lange coupler, and a Branch-line coupler.

The transmitter stage 230 includes an oscillator 231 and a power amplifier 232. Therefore, the signal generated from the oscillator 231 is amplified in the power amplifier 232, and then output to the first port 221 of the polarizer 220.

The receiver stage 240 includes a first amplifier 241, a second amplifier 242, a single-ended mixer 243, and a filter 244. The first amplifier 241 amplifies a reflection signal output through the second port 222 of the polarizer 220. It may be preferable to use the low-noise amplifier to build the first amplifier 241.

Meanwhile, if the isolation degree of the polarizer 220 is low, a leakage signal occurs during transmission of the transmission signal from the polarizer 220 to the antenna. Such a leakage signal flows to the receiver stage 240. The second amplifier 242 amplifies the leakage signal from the transmitter stage 230 to a certain power level. It may be preferable to use a variable gain amplifier to build the second amplifier 242. If the first amplifier 241 is sufficient to amplify the leakage signal, the second amplifier 242 can be omitted.

The single-ended mixer 243 uses as a mixer switching signal (that is, a local oscillator input signal $V_{LO}$) the leakage signal amplified by the second amplifier 242, and thus converts the reflection signal to a signal of a certain frequency.

The filter 244 filters the reflection signal converted into the signal of a certain frequency by the single-ended mixer 243. It may be preferable to use a low-pass filter for the filter 244.

Figure 5:
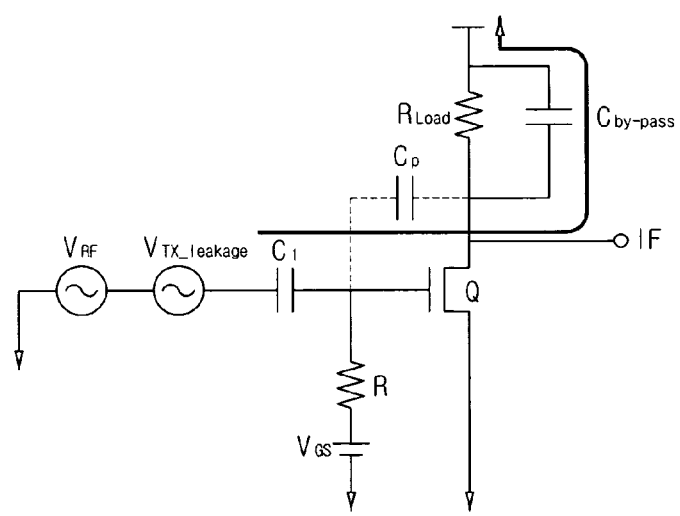
FIG. 5 is a circuit diagram for showing a structure of a single-ended mixer used in the radar system of FIG. 4.

FIG. 5 is a view for showing a structure of the single-ended mixer 243 used in the radar system of FIG. 4. The single-ended mixer 243 includes an MOS transistor Q, a resistor R, a power supply $V_{GS}$ and capacitors $C_{by\text{-}pass}$ and $C_1$. Although the single-ended mixer 243 includes the MOS transistor Q it may alternatively include a bipolar transistor. The reflection signal $V_{RF}$ and leakage signal VTX_leakage output from the polarizer 220 are input to the gate electrode of the MOS transistor Q. Capacitance $C_{by\text{-}pass}$ is provided to eliminate high-frequency components of the reflection signal and the leakage signal. That is, even though a signal is leaked out to the drain electrode (if a BJT, a collector terminal) due to parasitic capacitance Cp, the leakage signal is eliminated by the capacitance $C_{by\text{-}pass}$. The resistor R and the power supply $V_{GS}$ supply a bias voltage to the gate electrode of the MOS transistor Q. Thus, the leakage signal is used as a switching signal and then the reflection signal is converted into a certain IF signal, and output to the filter 244.

FIG. 3 shows the mixer 142 having different inputs between an oscillator and a reflection signal. Self-mixing may occur between the signal $V_{LO}$ and the reflection signal and between the signal $V_{LO}$ and the leakage signal due to the parasitic capacitance Cp between the gate-drain electrodes (if the BJT, base-collector terminals) of the transistor Q. Therefore, the amplifier in the base-band signal processor (not shown) can be saturated since a DC-offset occurs due to the self-mixing. However, if the leakage signal of the transmitter stage 230 is used as the switching signal as shown in FIG. 5, the self-mixing can be prevented.

As aforementioned, the present invention uses a circularly polarized antenna so as to enhance the reception sensitivity as well as to reduce the influence of interference waves. Further, since one circularly polarized antenna is used to receive and send signals, the radar system can be built in a compact size. Further, compared to a conventional radar system using a coupler in high frequency bands such as millimeter waves, the power attenuation can be reduced so that high power efficiency can be achieved. Further, since the leakage signal occurring during transmissions is used as a switching signal of the mixer, the DC-offset due to the self-mixing can be reduced.

The foregoing embodiments and advantages are merely exemplary and are not to be construed as limiting the present invention. The present teaching can be readily applied to other types of apparatuses. Also, the description of the exemplary embodiments of the present invention is intended to be illustrative, and not to limit the scope of the claims, and many alternatives, modifications, and variations will be apparent to those skilled in the art.

What is claimed is:

1. A radar system comprising:
a transmitter stage which generates a transmission signal, and extracts a leakage signal from the generated transmission signal;
a circularly polarized antenna which transmits the transmission signal as a circularly polarized signal, and receives a reflection signal;
a polarizer coupled between the transmitter stage and the circularly polarized antenna, which receives the transmission signal from the transmitter stage, outputs the transmission signal to the circularly polarized antenna, isolates the reflection signal received via the circularly polarized antenna from the transmission signal, and outputs the reflection signal; and
a receiver stage which receives the reflection signal from the polarizer, receives the extracted leakage signal from the transmitter stage, and converts the received reflection signal into an output signal of a certain frequency using the leakage signal as a switching signal.

2. The radar system as claimed in claim 1, wherein the transmission signal and the reflection signal are circularly polarized in opposite directions.

3. The radar system as claimed in claim 1, wherein the polarizer isolates the transmission signal and the reflection signal by making a phase difference of 90° between the transmission signal and the reflection signal.

4. The radar system as claimed in claim 1, wherein the transmitter stage comprises:
an oscillator which generates the transmission signal;
a directional coupler which couples the transmission signal generated by the oscillator, and extracts the leakage signal from the transmission signal; and
a power amplifier which amplifies the transmission signal, and outputs the amplified transmission signal to the polarizer.

5. The radar system as claimed in claim 4, wherein the receiver stage comprises:
a low-noise amplifier which amplifies the reflection signal output by the polarizer;
a mixer which receives the leakage signal from the directional coupler and the amplified reflection signal from the low-noise amplifier, and mixes the amplified reflection signal and the leakage signal to generate the output signal of the certain frequency; and
a filter which filters the output signal generated by the mixer.

6. The radar system as claimed in claim 5, wherein the mixer comprises:
a transistor including a gate electrode which receives a signal from the oscillator, and a drain electrode which receives the reflection signal and the leakage signal;
an inductor connected to the drain electrode of the transistor to operate as a radio frequency (RF) choke that cuts off leakage of an RF signal into an output terminal; and
a resistor in series with a power source and coupled to the gate electrode of the transistor to apply a bias voltage to the gate of the transistor.

7. The radar system as claimed in claim 5, wherein the mixer shifts a frequency of the leakage signal to match a frequency of a reflection signal.

8. The radar system as claimed in claim 5, wherein the mixer compensates for an interference of the transmission signal with the reflection signal in the polarizer using the leakage signal as the switching signal.

9. The radar system as claimed in claim 1, wherein the polarizer comprises at least one of a directional coupler, a Lange coupler, and a Branch-line coupler.

10. The radar system as claimed in claim 1, wherein the extracted leakage signal is representative of a leakage of the transmission signal during transmission of the transmission signal from the polarizer to the circularly polarized antenna.

11. A radar system comprising:
a transmitter stage which generates a transmission signal;
a circularly polarized antenna which transmits the transmission signal as a circularly polarized signal, and receives a reflection signal;
a polarizer coupled between the transmitter stage and the circularly polarized antenna, which receives the transmission signal from the transmitter stage, transmits the transmission signal to the circularly polarized antenna, isolates the reflection signal received from the circularly polarized antenna from the transmission signal, and outputs the reflection signal, wherein a leakage signal is produced by leakage of the transmission signal during the transmission from the polarizer to the circularly polarized antenna; and
a receiver stage which receives the reflection signal and the leakage signal, converts the reflection signal to a signal of a certain frequency by using the leakage signal switching signal, and outputs the converted reflection signal of the certain frequency.

12. The radar system as claimed in claim 11, wherein the transmission signal and the reflection signal are circularly polarized in opposite directions.

13. The radar system as claimed in claim 11, wherein the polarizer isolates the transmission signal and the reflection signal by making a phase difference of 90° between the transmission signal and the reflection signal.

14. The radar system as claimed in claim 11, wherein the transmitter stage comprises:
an oscillator which generates the transmission signal; and
a power amplifier which amplifies the transmission signal generated by the oscillator.

15. The radar system as claimed in claim 14, wherein the receiver stage comprises:
a first amplifier which amplifies the reflection signal and the leakage signal;
a single-ended mixer coupled to the amplifier, which mixer converts the reflection signal amplified by the first amplifier to the signal of the certain frequency by using the leakage signal amplified by the first amplifier as a mixer switching signal, and outputs the converted reflection signal; and
a filter which filters the converted reflection signal output by the single-ended mixer.

16. The radar system as claimed in claim 15, wherein the single-ended mixer comprises:
a transistor including a gate electrode which receives the reflection signal and leakage signal from the polarizer;
a capacitance which is connected to a drain electrode of the transistor and eliminates high-frequency components of the reflection signal and the leakage signal; and
a resistor in series with a power supply and coupled to the gate electrode of the transistor to supply a bias voltage to the gate electrode of the transistor.

17. The radar system as claimed in claim 15, further comprising:
a second amplifier coupled between the first amplifier and the mixer.

18. The radar system as claimed in claim 15, wherein the leakage signal, produced during the transmission of the transmission signal via the polarizer, interferes with the reflection signal and wherein the single-ended mixer compensates an interference of the transmission signal based on the leakage signal.

19. The radar system as claimed in claim 11, wherein the polarizer comprises at least one of a directional coupler, a Lange coupler, and a Branch-line coupler

* * * * *